United States Patent
Oshima et al.

(10) Patent No.: US 7,005,922 B2
(45) Date of Patent: Feb. 28, 2006

(54) VARIABLE GAIN AMPLIFIER CIRCUIT AND GAIN CONTROL METHOD THEREOF

(75) Inventors: Takashi Oshima, Saitama (JP); Takeshi Doi, Uwajima (JP); Kenji Maio, Tokyo (JP); Irei Kyu, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 82 days.

(21) Appl. No.: 10/790,184

(22) Filed: Mar. 2, 2004

(65) Prior Publication Data

US 2004/0229586 A1 Nov. 18, 2004

(30) Foreign Application Priority Data

Apr. 14, 2003 (JP) ............................. 2003-108720

(51) Int. Cl.
*H03G 3/10* (2006.01)

(52) U.S. Cl. ..................... 330/278; 330/98; 330/254; 455/234.2; 455/245.2; 455/246.1; 455/247.1

(58) Field of Classification Search ................ 330/278, 330/254, 98, 310; 327/560; 455/234.2, 455/245.2, 246.1, 247.1
See application file for complete search history.

(56) References Cited

U.S. PATENT DOCUMENTS

| 4,456,889 A * | 6/1984 | Kumar ....................... 330/279 |
| 6,498,927 B1 * | 12/2002 | Kang et al. .............. 455/245.2 |
| 6,927,628 B1 * | 8/2005 | Oshima et al. ............. 330/133 |
| 2003/0218501 A1 | 11/2003 | Oshima et al. |

FOREIGN PATENT DOCUMENTS

| JP | 2002-016462 | 1/2002 |
| JP | 2003-347873 | 12/2003 |

OTHER PUBLICATIONS

Stroet et al., "A Zero-IF Single-Chip Transceiver for up to 22Mb/s QPSK IEEE802.11b Wireless LAN," *ISSCC 2001,* Session 13, No. 13.5, Visual Supplement, pp. 164 and 165.

* cited by examiner

*Primary Examiner*—Michael B. Shingleton
(74) *Attorney, Agent, or Firm*—Antonelli, Terry, Stout and Kraus, LLP.

(57) ABSTRACT

In order to rapidly control the gains of a plurality of variable gain amplifiers VGAs, each of gain control circuits is configured to determine a gain to be set therein, based on gain control information received from other gain control circuits existing in its preceding stage or stages and the signal level detected by a level detector circuit connected thereto. By carrying out such gain control, a total application gain is stabilized more quickly by gain control. Therefore, even in receiving systems that the preparation period for reception is very short, desired gain control is achieved within this period and stable data reception can be performed.

10 Claims, 12 Drawing Sheets

VARIABLE GAIN AMPLIFIER CIRCUIT AND GAIN CONTROL METHOD THEREOF

BACKGROUND OF THE INVENTION

1. Field of the Invention

The present invention relates to a variable gain amplifier circuit and a gain control method thereof. More particularly, the invention-relates to a variable gain amplifier circuit comprising variable gain amplifiers for low frequency concatenated in a multistage chain and a gain control method thereof, suitable for use in an integrated circuit (hereinafter abbreviated to IC) in which a variable gain low-noise amplifier for high frequency exists with the variable gain amplifiers for low frequency.

2. Description of the Related Art

Figure 1:
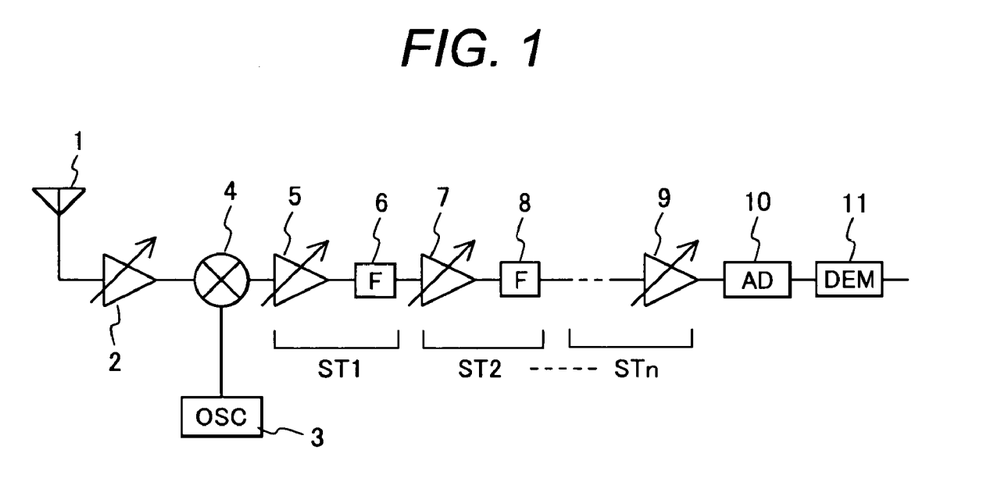
FIG. 1 is a block diagram showing an example of circuit topology of conventional and common wireless receivers.

FIG. 1 shows a typical circuit topology of conventional wireless receivers of low intermediate frequency (low IF) architecture. A high frequency signal received by an antenna 1 is amplified by a variable gain low-noise amplifier 2, mixed with a reference wave from a local oscillator circuit (OSC) 3 by a mixer 4, and thereby converted into a low frequency signal. This low frequency signal further passes through, normally, a plurality of variable gain amplifiers for low frequency 5, 7, and 9 and filters (F) 6 and 8 (this section consists of n stages of low-frequency signal amplifiers, ST1 through STn, one stage consisting of a couple of a variable gain amplifier for low frequency and a filter, in order to amplify the signal up to a required power level). Then, an AD converter (AD) 10 converts the thus amplified signal into a digital signal and a demodulator (DEM) 11 demodulates the signal into data of communication.

Also, it is widely practiced to substitute a fixed gain low-noise amplifier for the variable gain low-noise amplifier 2. However, because the domain of linear amplification of receivers becomes narrower due to recent IC design for good performance with a lower supply voltage, it is more advantageous to provide the amplifier with a variable gain function to restrain its output amplitude range, for example, to reduce the gain for input signals with a high power level. The variable gain amplifiers for low frequency 5, 7, and 9 adjust the signal level so that the level of the signal input to the AD converter 10 becomes a predetermined value. Circuits for controlling the variable gain low-noise amplifier 2 and the variable gain amplifiers 5, 7, and 9 are not shown in FIG. 1.

Figure 2:
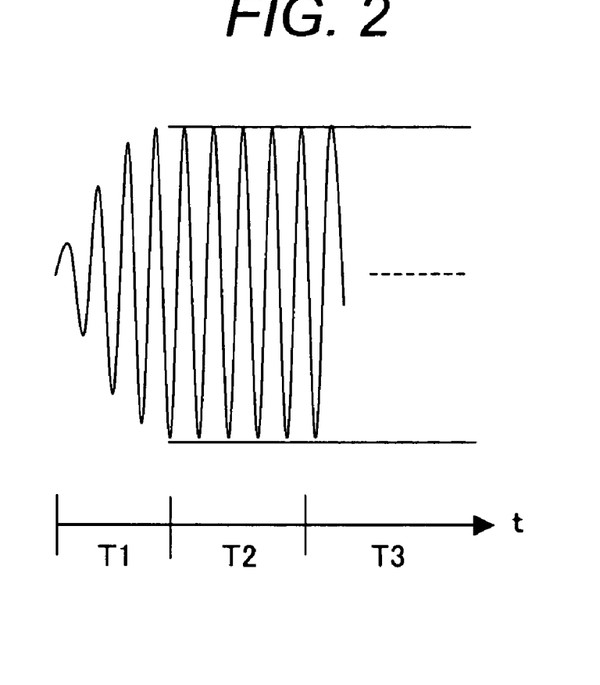
FIG. 2 shows a typical input signal waveform of carrier signals which are used in wireless communication.

FIG. 2 shows a typical signal waveform of carrier signals which are actually used in wireless communication. Both the signal input to the variable gain low-noise amplifier 2 and the signal input to the variable gain amplifier 5 have the waveform shown in FIG. 2. However, the signal input to the former amplifier normally has a high frequency of a few GHz, whereas the signal input to the latter amplifier normally has a frequency of a few MHz because it is converted to a low frequency by the mixer 4.

As shown in FIG. 2, the waveform sequence includes a rise period T1 of the waveform and a preparation period T2 for data signal reception. Taking advantage of the rise period T1 of the waveform and the preparation period T2 for reception, gain control of the variable gain low-noise amplifier 2 and the variable gain amplifiers 5, 7, and 9 must be performed to adjust the gain of each above amplifier to an optimum gain which must be maintained during a data signal period T3.

However, the preparation period T2 for reception is generally defined to be very short; for example, this period is only 4 $\mu$s, as defined by the standard (IEEE 802.15.1) for short range data communication. Therefore, a method for controlling the gain of each above amplifier to be optimum for a very short period is needed.

Figure 3:
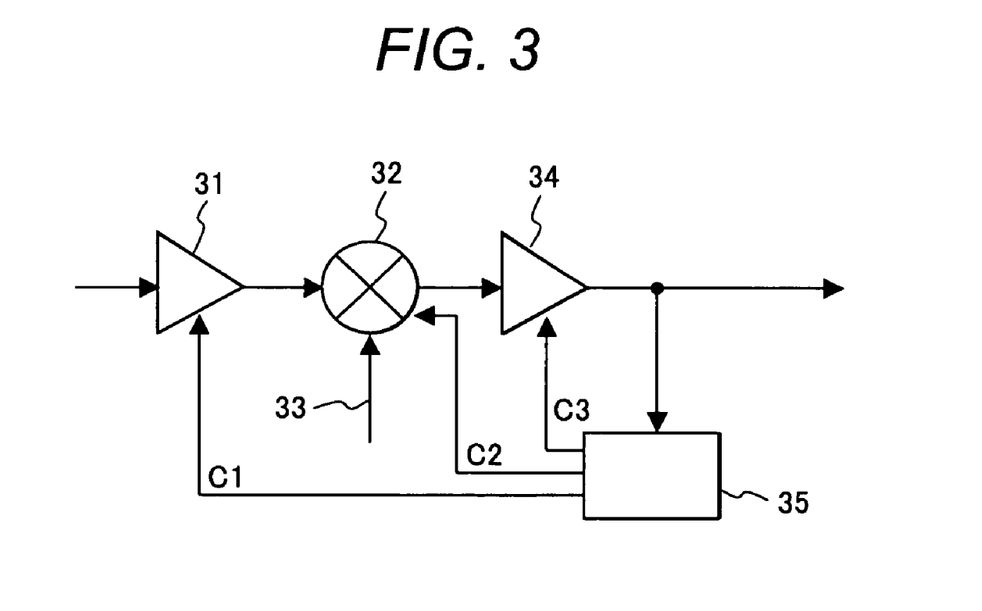
FIG. 3 is a block circuit diagram showing an example of prior-art gain control circuit topology.

As for prior art of such gain control, as is shown in FIG. 3, a receiver circuit which comprises a low-noise amplifier 31 which outputs a signal with variable gain adjusted by control signal C1, a mixer 32 which mixes its input RF (high frequency) signal with a local oscillation signal 33 to convert the signal into an intermediate frequency signal and outputs the intermediate frequency signal with variable gain adjusted by control signal C2, a variable gain amplifier 34 for low frequency which outputs a signal with variable gain adjusted by control signal C3, and a control circuit which generates the control signals C1, C2, and C3 which vary, depending on the output of the variable gain amplifier 34, and a method for controlling the receiving gain have been known (for example, refer to Japanese Patent Document Cited 1).

In this prior art example, the level of the signal output from the variable gain amplifier 34 for low frequency is detected and, based on the detected signal level, the control circuit 35 controls the gains of the low-noise amplifier 31, mixer 32, and variable gain amplifier 34 to adjust each gain to an optimum value.

Similar topology is found in a receiving circuit of a wireless LAN chip provided by Philips Semiconductors, Inc. (refer to Non-Patent Document Cited 1).

[Japanese Patent Document Cited 1]
Japanese Published Unexamined Patent Application No. 2002-016462

[Non-Patent Document Cited 1]
ISSCC2001/SESSION13/WIRELESS LAN/13.5, VISUALS SUPPLEMENT p.164

SUMMARY OF THE INVENTION

In the case of the above prior art disclosed in Japanese Patent Document Cited 1, the level of the signal output from the variable gain amplifier 34 is only detected, but the level of the signal output from the mixer 32 is not detected. Therefore, for example, even when the control circuit 35 has detected saturated output signal level of the variable gain amplifier 34, it cannot determine whether the signal level has already been saturated at the point of time of output from the mixer 32. In consequence, the control circuit 35 cannot determine whether to reduce the gains of the low-noise amplifier 31 and the mixer 32 and has to try and select a gain setting repeatedly, in possible consequence of which, it takes time until gain control finally stabilizes the gain.

Accordingly, in the prior-art gain control method applied to variable gain amplifiers, it takes time until the total amplification gain is stabilized and, therefore, there is a possibility that gain control is too late for the preparation period for data signal reception in some communications system, if this period is very short.

It is therefore an object of the present invention to provide a variable gain amplifier circuit comprising a plurality of variable gain amplifiers and a gain control method that rapidly controls the gains of these amplifiers to be optimum, which are suitable for use in an IC for a wireless receiver.

A typical aspect of the invention disclosed herein will be briefly summarized below. A variable gain amplifier circuit of the present invention comprises a plurality of variable gain amplifiers and is characterized as follows. To a first stage variable gain amplifier, an output level detector circuit which detects the signal level output from the first stage and a first gain control circuit to which the output signal level detected is input are connected. To second stage and subsequent variable gain amplifiers, input level detector circuits which detect their input signal levels are connected and a second gain control circuit is connected to which the input signal levels detected and gain control information obtained at the first stage and their preceding stage variable gain amplifier or amplifiers are input.

A gain control method for the variable gain amplifier circuit of the present invention is characterized by comprising: performing gain control of the first stage variable gain amplifier, based on its output level; and performing gain control of the second stage and subsequent variable gain amplifiers by determining a gain to be set therein from gain control information obtained at the first stage and gain control information obtained at their preceding stage or stages and from their input signal levels detected. By carrying out such gain control, time to stabilize the total amplification gain of the variable gain amplifier circuit by gain control can be shortened.

The above advantages and other advantages, objects, and features of this invention will be apparent from the following detailed description of the preferred embodiments with reference to the accompanying drawings and the attached claims.

DETAILED DESCRIPTION OF THE PREFERRED EMBODIMENTS

Preferred embodiments of the present invention will be described in detail hereinafter with reference to the accompanying drawings.

<Embodiment 1>

Figure 4:
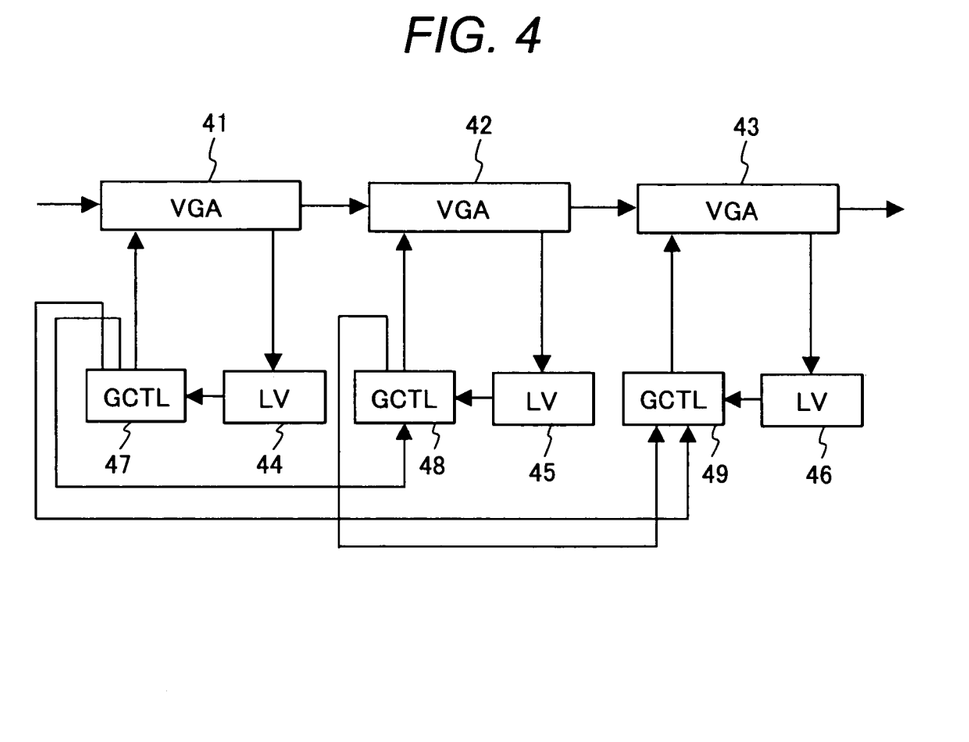
FIG. 4 is a block circuit diagram showing a preferred Embodiment 1 of the present invention.

FIG. 4 is a block circuit diagram that shows a preferred Embodiment 1 of the present invention. This circuit topology corresponds to the section comprising a plurality of stages of variable gain amplifiers for low frequency after the mixer and before the AD converter in the receiver circuitry of low intermediate frequency architecture of FIG. 1. As shown in FIG. 4, a variable gain amplifier circuit of Embodiment 1 is made up of variable gain circuits (VGA) 41, 42, and 43, level detector circuits (LV) 44, 45, and 46 connected to the VGAs, and gain control circuits (GCTL) 47, 48, and 49 which control the gains of the variable gain circuits 41, 42, and 43, based on the outputs of the level detector circuits.

Each of the variable gain circuits 41 to 43 may consist simply of a single-stage variable gain amplifier or multiple stages of variable gain amplifiers and filters in complex arrangement. The inputs of the level detector circuits 44 to 46 may be connected to any of the input, output, and internal nodes of the variable gain circuits 41 to 43. If one variable gain circuit includes a plurality of variable gain amplifiers, its level detector circuit detects signal levels at a plurality of nodes, each on each gain amplifier, and its gain control circuit can return a plurality of gain control outputs to it, based on the detected signal levels.

While three stages of variable gain circuits are provided in the chain of amplification shown in FIG. 4, an arbitrary number of stages of these circuits may be concatenated.

A noticeable feature of this circuit topology is that a gain control circuit determines a gain to be set therein, based on gain control information received from one or more other gain control circuits existing in its preceding stage or stages, as shown in FIG. 4. For example, the gain control circuit 48 receives information about gain control from the gain control circuit 47 existing in its preceding stage. The gain control circuit 49 receives gain control information from the gain control circuits 47 and 48 existing in its preceding stages.

Figure 5:
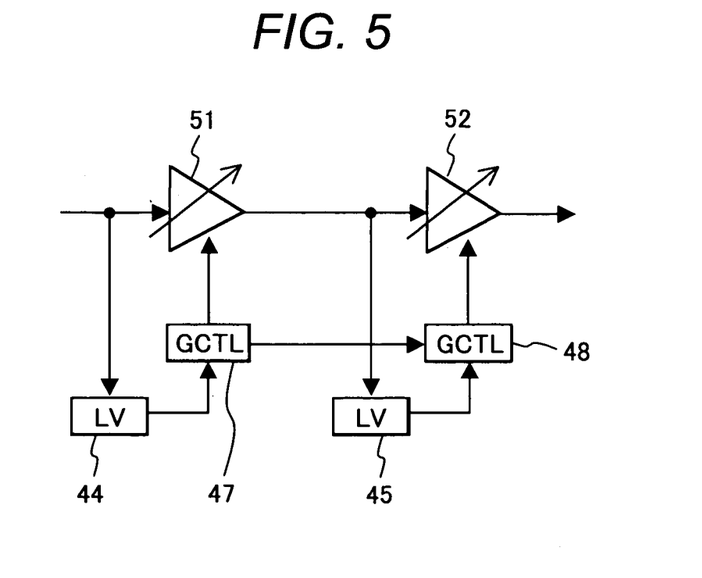
FIG. 5 is a block circuit diagram showing a simplified arrangement of the topology of FIG. 4, comprising two stages of variable gain circuits, each consisting simply of a single-stage variable gain amplifier.
Figure 6:
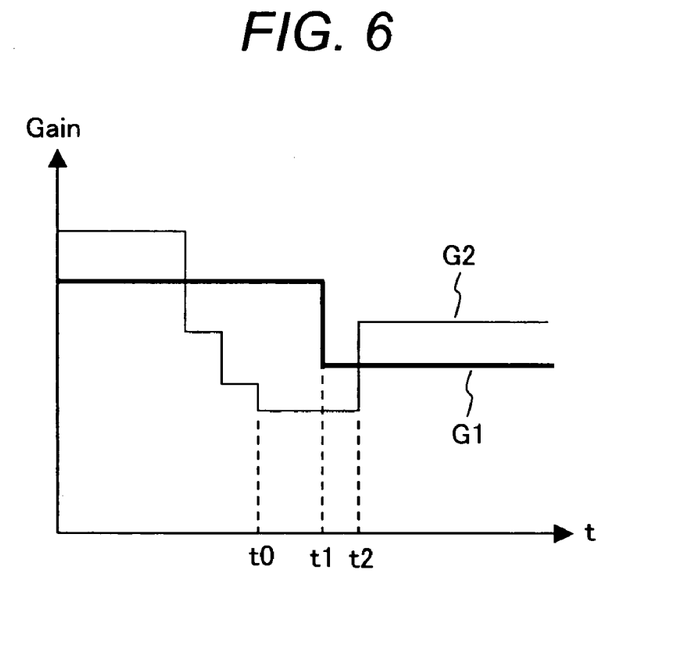
FIG. 6 is a graph representing gain stabilization by gain control using the prior-art gain control method for the circuit shown in FIG. 5.
Figure 7:
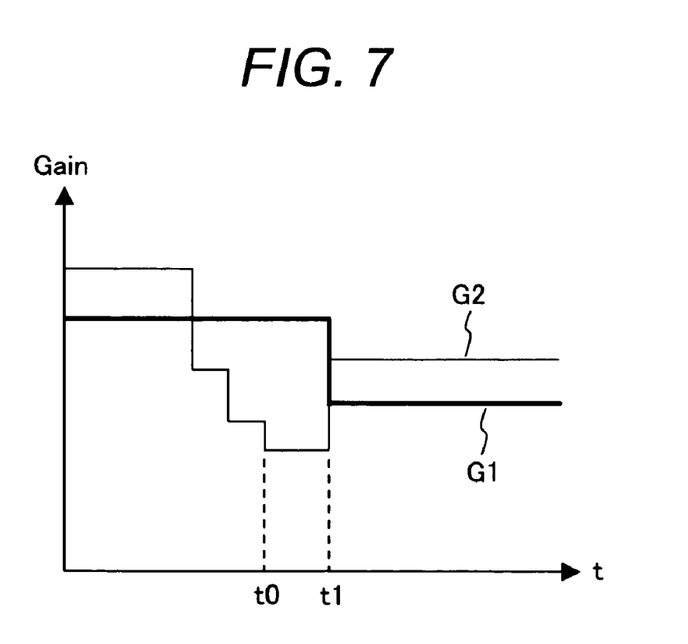
FIG. 7 is a graph representing gain stabilization by gain control using the gain control method of the present invention for the circuit shown in FIG. 5.

The effectiveness of the present invention is discussed, using FIGS. 5 through 7. FIG. 5 shows a simplified arrangement of the topology of FIG. 4, comprising two stages of variable gain circuits, each consisting simply of a single-stage variable gain amplifier. As shown in FIG. 5, this arrangement of two stages of variable gain circuits is made up of a first variable gain amplifier 51, a second variable gain amplifier 52, a first level detector circuit 44, a second level detector circuit 45, a first gain control circuit 47, and a second gain control circuit 48.

The level detector circuits 44 and 45 and the gain control circuits 47 and 48 are assumed to operate in synchronization with a predetermined reference clock. The first variable gain amplifier 51 is supplied with one of two gains, depending on whether the signal level detected by the level detector circuit 44 exceeds a predetermined threshold. The gain of the second variable gain amplifier 52 is controllable to a more exact degree, according to the signal level detected by the second level detector circuit 45.

Because an input signal has the rise waveform as shown in FIG. 2, the gain G2 of the second variable gain amplifier 52 is controlled so that it will decrease gradually and stabilize at a constant value at time t0, as shown in FIGS. 6 and 7. On the other hand, the gain G1 of the first variable gain amplifier 51 is initially set at a high value, but it is controlled by the first gain control circuit 47 so that it will stabilize at a lower value at time t1 when the signal level detected by the level detector circuit 44 has exceeded the predetermined threshold as the input waveform has risen fully.

At this time, the first gain control circuit 47 transmits information of gain decrease to the second gain control circuit 48 and the second gain control circuit 48 controls the gain G2 of the second variable gain amplifier 52, based on the above information and the signal level detected by the second level detector circuit 45.

For example, when the first gain control circuit 47 causes a decrease of 8 dB in the gain G1 of the first variable gain amplifier 51, the second gain control circuit 48 causes an increase of 8 dB in the gain G2 of the second variable gain amplifier 52, based on the information of the gain decrease, and, thereby, gain control can be completed immediately at time t1 as shown in FIG. 7.

In the prior-art gain control method in which the first gain control circuit 47 does not transmit the gain control information to the second gain control circuit 48, gain control cannot be completed at time t1 and its completion is one cycle later at time t1, as shown in FIG. 6.

While the two-stage circuit arrangement has now been discussed for simplification, more complex arrangement comprising n stages of variable gain circuits and gain control circuits may be applied generally, like the topology shown in FIG. 4. In this case, in the gain control method set forth in the present embodiment, in which gain control information is transmitted from forward to backward gain control circuits and the backward gain control circuits determine the gain, based on that information, the gain control stabilizes the gain at time t1. In the prior-art gain control method, the gain control stabilizes the gain at (n−1) cycles later than time t1 and, consequently, it is difficult to complete the gain control within a predetermined preparation period for reception.

Figure 15:
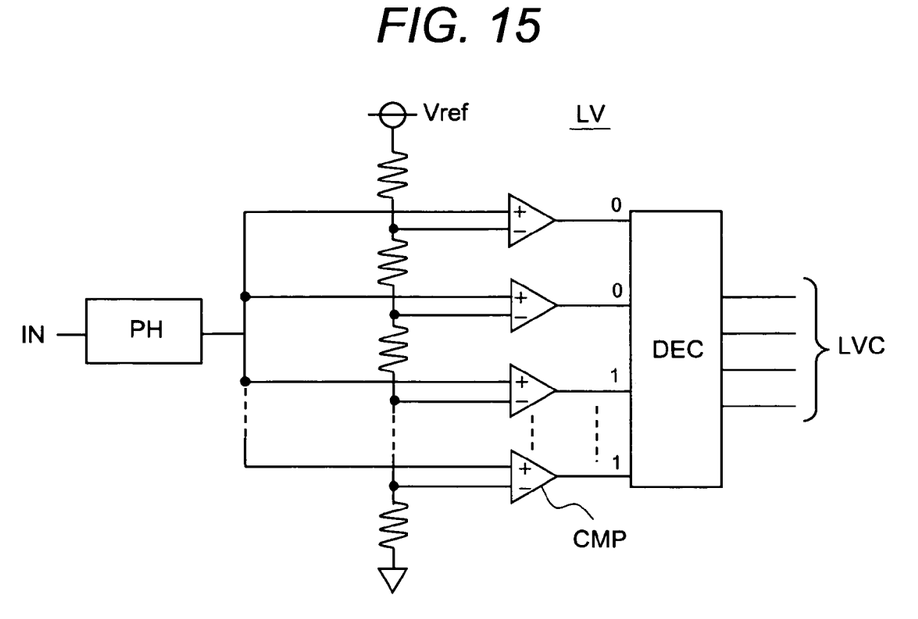
FIG. 15 is a diagram showing a topology example of a level detector circuit.

Then, an example of level detector circuit LV topology and an example of gain control circuit GCTL topology will be described. FIG. 15 shows an example of level detector circuit topology. The level detector circuit is made up of a peak hold circuit PH, a resistor circuit in which a plurality of resistors are connected in series between reference voltage Vref and ground, a plurality of comparators CMP, each of which compares the voltage at a node connecting to each resistor with the output of the peak hold circuit PH, and a decoder DEC which converts the output from each comparator into a digital output value of level code LVC. Specific resistance of each resistor is set to a value so that an input signal level is converted into a value in decibels. The number of the comparators should be determined, according to the required accuracy of signal level detection. The more the comparators, the signal level can be detected more exactly, whereas increase in the number of transistors and power consumption must be taken into consideration.

The peak level value of the voltage of an input signal IN is held by the peak hold circuit PH. In the case of the circuit example shown in FIG. 16, a voltage value corresponding to the signal level in the voltage drop direction relative to Vref is held; that is, voltage to be held=Vref−signal level value. The thus held voltage is compared by each comparator with the voltage at each node in the resistor circuit. Each comparator outputs "1" if the held voltage is higher than the node voltage or "0" if the held voltage is lower. From the outputs of the comparators, a sequence of "0s" in proportion to a decibel value of the signal level is output and input to the decoder DEC. For example, in FIG. 15, a value of "00" is input to the decoder and this value is assumed corresponding to a peak value of 6 dB. The decoder converts the input "00" into a digital value of level code (LVC), based on preset relationship between "0s" and decibel equivalents, and outputs the LVC. For example, if the decoder outputs a four-bit binary code, the decoder outputs a level code "0110" corresponding to the peak value of 6 dB. In this level detector circuit, the circuit topology from the resistor circuit block to the decoder is the same as the input block of a generally known flash ADC (analog-digital converter) and can be constructed by using CMOS devices.

Figure 16:
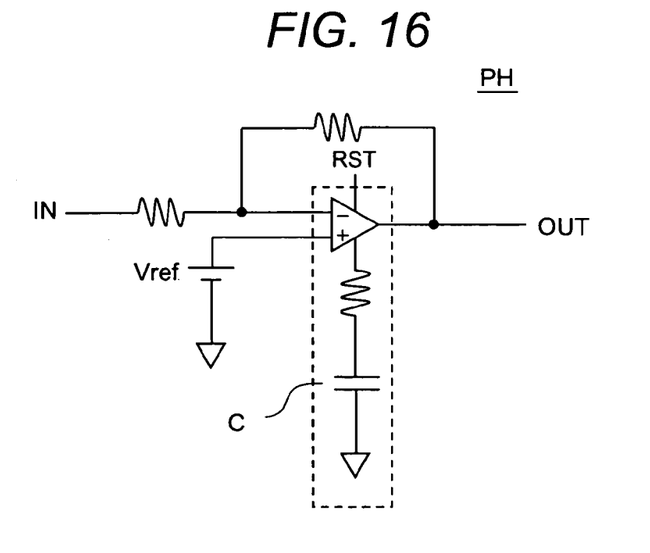
FIG. 16 is a diagram showing a rough topology of a peak hold circuit.
Figure 17:
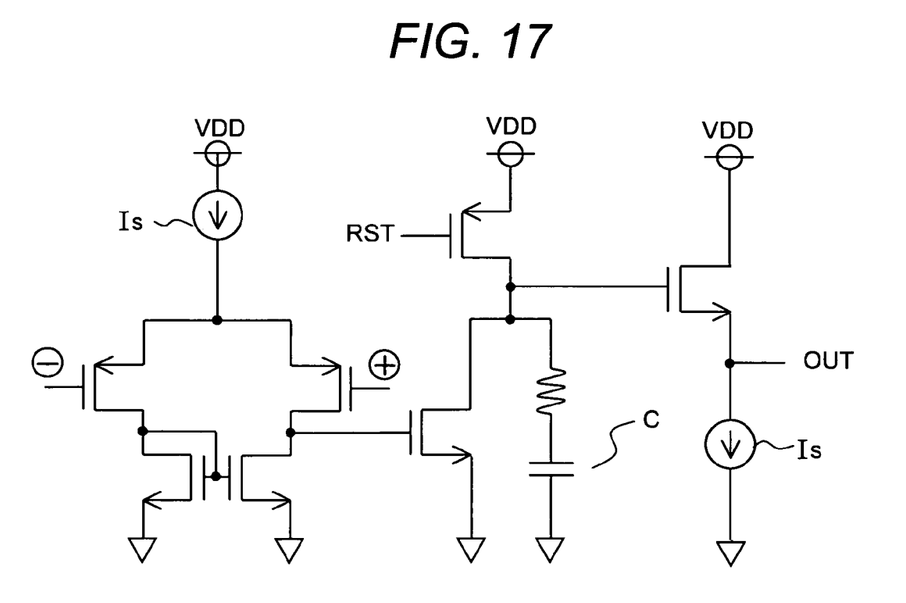
FIG. 17 is a diagram showing a detailed circuit view of a dotted section in FIG. 16.
Figure 18:
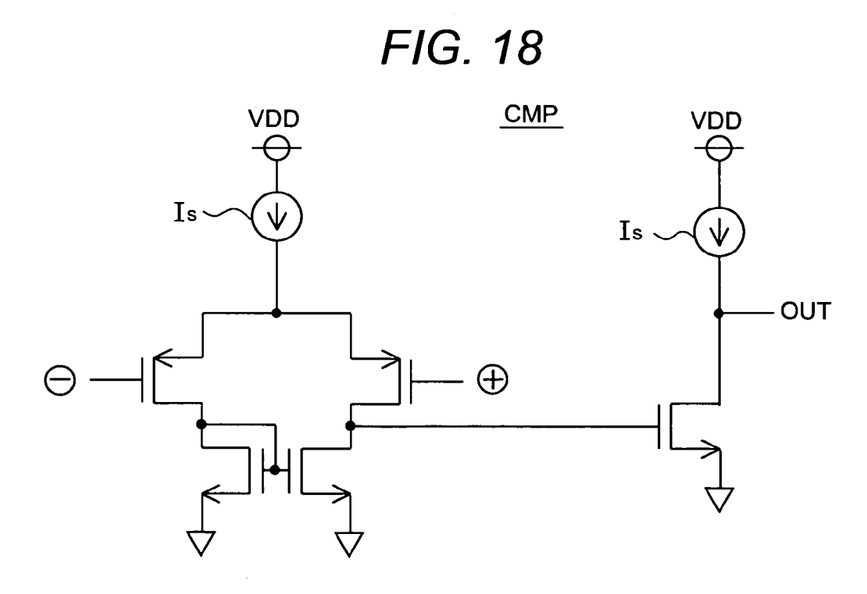
FIG. 18 is a diagram showing a topology example of a comparator.

FIG. 16 shows an outline topology of the peak hold circuit and FIG. 17 shows a detailed circuit view of a dotted section including hold capacitance C in FIG. 16. This peak hold circuit PH resets (tracks) the peak voltage to zero when the reset terminal RST is Low and holds the peak voltage when the reset terminal is High. As shown in FIG. 17, the peak hold circuit can be constructed by using CMOS devices. The comparator CMP should be configured as a simple two-stage circuit, as is shown in FIG. 18, which operates such that its output OUT is set high when voltage input to the plus (+) terminal is higher than that to the minus (−) terminal. In FIGS. 17 and 18, Is is the current source of the MOS and Vdd is power supply voltage of high potential side. In this way, all the level detector circuits can be configured by using CMOS devices.

Figure 19:
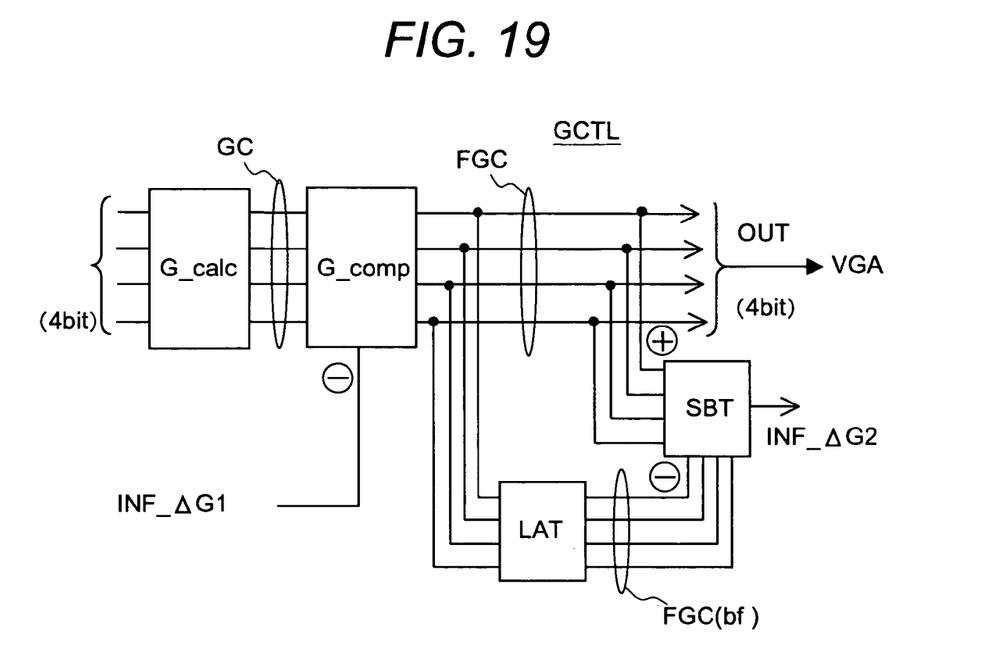
FIG. 19 is a diagram showing a topology example of a gain control circuit (GCTL) shown in FIG. 4.

FIG. 19 shows a topology example of a gain control circuit (GCTL) shown in FIG. 4. This circuit will now be explained, using the gain control circuit 48 which controls the variable gain circuit (VGA) 42 as an example. The gain control circuit is made up of a gain calculation circuit bock G_calc, a gain compensation circuit block G_comp, a latch LAT, and a subtraction circuit block SBT.

The gain calculation circuit bock G_calc receives a four-bit level code from the level detector circuit 45, subtracts the code value from a target level value, and outputs a gain code GC. That is, it calculates the following: gain code GC [dB]=target level [dB]−LVC [dB]. Here, the target level is a target output signal level from each variable gain circuit, which must be set for the variable gain circuit beforehand when the variable gain amplifier circuit is designed.

The gain compensation circuit block G_comp compensates the gain by subtracting preceding-stage gain increase INF_ΔG1 received as gain control information from the preceding-stage gain control circuit 47 from the gain code GC and outputs a final gain code FGC. That is, it calculates the following: final gain code FGC=gain code GC [dB]−INF_ΔG1 [dB]. The preceding-stage gain increase INF_ΔG1 corresponds to information of change in dB of the gain of the preceding-stage variable gain circuit made by the ongoing gain control.

The final gain code FGC is input to the variable gain circuit 42, latch LAT, and subtraction circuit block SBT as shown in FIG. 19; however, exactly speaking, the latch LAT still retains the last latched final gain code FGC (bf) and the final gain code FGC has not yet been latched at this point of time.

The gain of the variable gain circuit 42 is controlled to equal the gain value of the final gain code FGC output from the gain control circuit. The subtraction circuit block SBT subtracts the final gain code FGC input to it from the last latched gain code FGC (bf) stored on the latch. The resulting gain difference is transmitted to the following gain control circuit 49 as gain control information INF_ΔG2 [dB] of ongoing gain change. At this point of time, the latch latches onto the ongoing final gain code FGC and stores it. Latching timing of the latch should be controlled by using a clock signal from a timing generation circuit, though this circuit is not shown.

<Embodiment 2>

Figure 8:
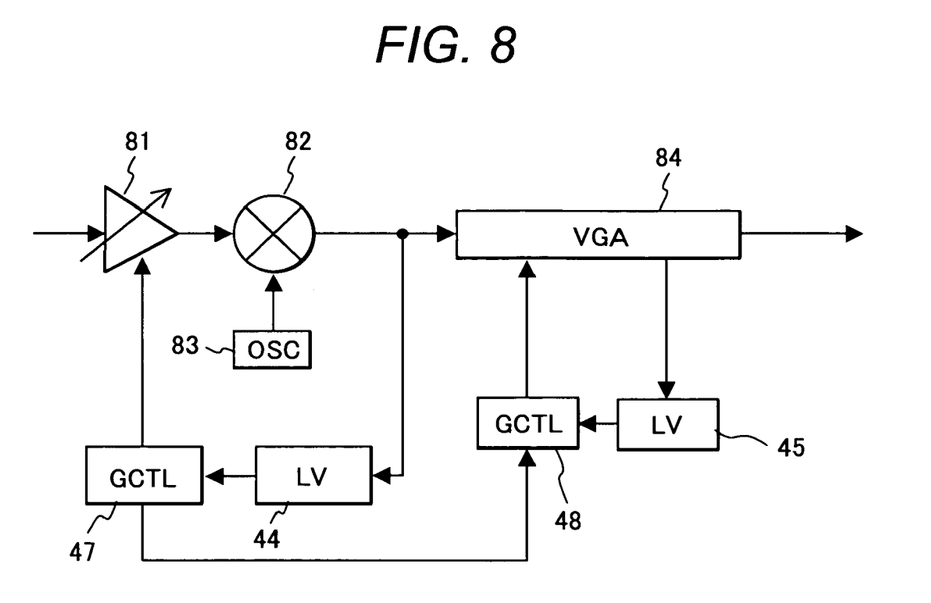
FIG. 8 is a block circuit diagram showing a preferred Embodiment 2 of the present invention.

FIG. 8 shows a preferred Embodiment 2 of the present invention. Embodiment 2 is configured, as shown in FIG. 8, such that the signal level output from a mixer 82 is detected by a first level detector circuit (LV) 44 and a first gain control circuit (GCTL) 47 controls the gain of a variable gain low-noise amplifier 81, based on the detected signal level. On the other hand, a second level detector circuit 45 detects the signal level at one or a plurality of input, output, and internal nodes of a variable gain circuit (VGA) 84 and a second gain control circuit 48 controls the gain of the variable gain circuit, based on the detected signal level and gain control information received from the first gain control circuit 47.

<Embodiment 3>

Figure 9:
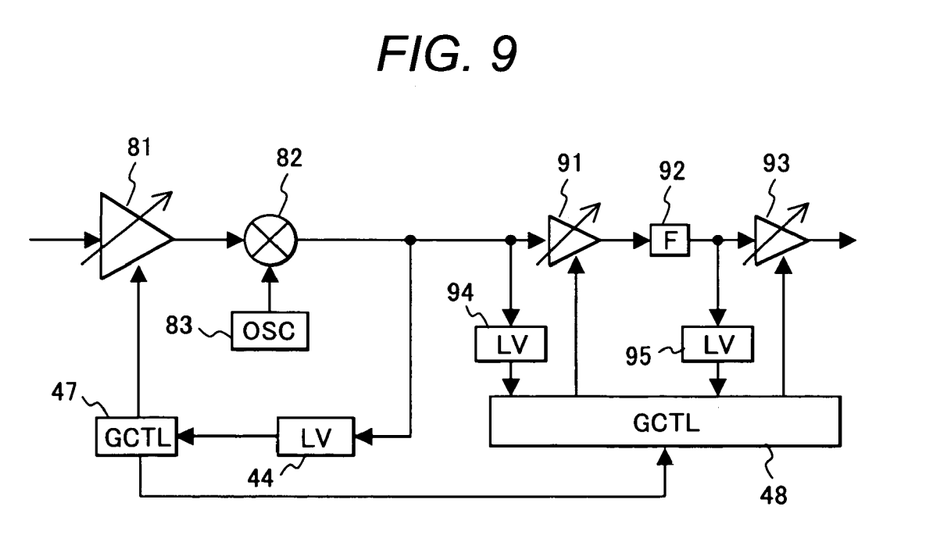
FIG. 9 is a block circuit diagram showing a preferred Embodiment 3 of the present invention.

FIG. 9 shows a preferred Embodiment 3 of the present invention. Difference of Embodiment 3 from Embodiment 2 shown in FIG. 7 resides in more complex configuration of the section of the variable gain circuit 84. That is, the variable gain circuit is made up of variable gain amplifiers 91, 93, and a filter 92, as shown in FIG. 9. To the inputs of the variable gain amplifiers 91 and 93, level detector circuits 94 and 95 are respectively connected so that they can detect the signal levels at the inputs of the variable gain amplifiers 91 and 93, separately.

The second gain control circuit 48 controls the gains of the variable gain amplifiers 91 and 93, based on the signal levels detected by the level detector circuits 94 and 95 and gain control information received from the first gain control circuit 47. While the variable gain circuit is formed of two stages of variable gain amplifiers and one stage of filter in the present embodiment, the number of stages of these elements and arrangement thereof are not so limited and it is a matter of course that alteration or modification thereto may be made as required.

Figure 10:
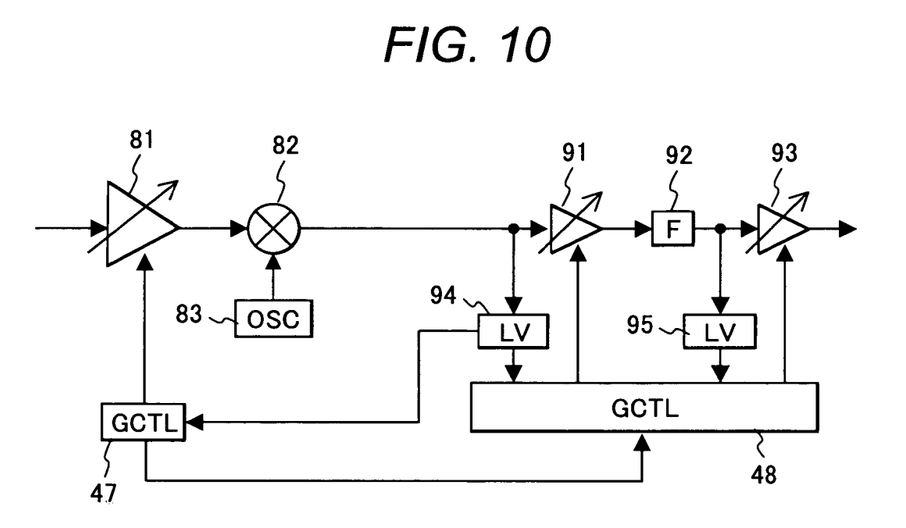
FIG. 10 is a block circuit diagram showing an example of modification to the circuitry example shown in FIG. 9.

The level detector circuit 44 shown in FIG. 9 may be removed and the level detector circuit 94 may perform the function of the removed detector in addition to its own function as is shown in FIG. 10.

<Embodiment 4>

Figure 11:
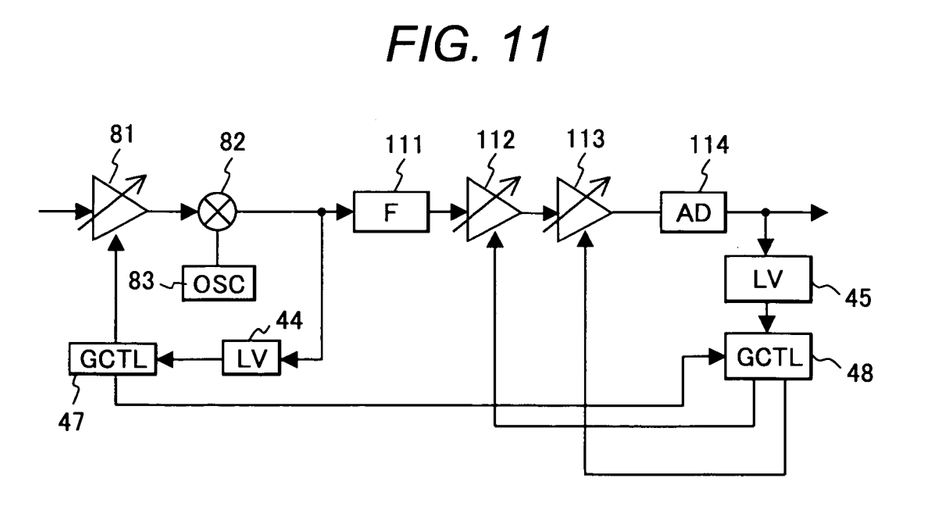
FIG. 11 is a block circuit diagram showing a preferred Embodiment 4 of the present invention.

FIG. 11 shows a preferred Embodiment 4 of the present invention. Unlike the circuitry shown in FIGS. 9 and 10, Embodiment 4 is configured such that the second level detector circuit 45 is connected to the output end of the low frequency section and the second gain control circuit 48 controls the gains of variable gain amplifiers 112 and 113, based on the signal level detected by the detector circuit 45.

In the circuitry thus configured, because a filter before the variable gain amplifiers 112 and 113 sufficiently suppresses interference components, the circuitry of Embodiment 4 has an advantage that the variable gain amplifiers 112 and 113 are not required to have a high linearity, as compared with Embodiment 3.

<Embodiment 5>

Figure 12:
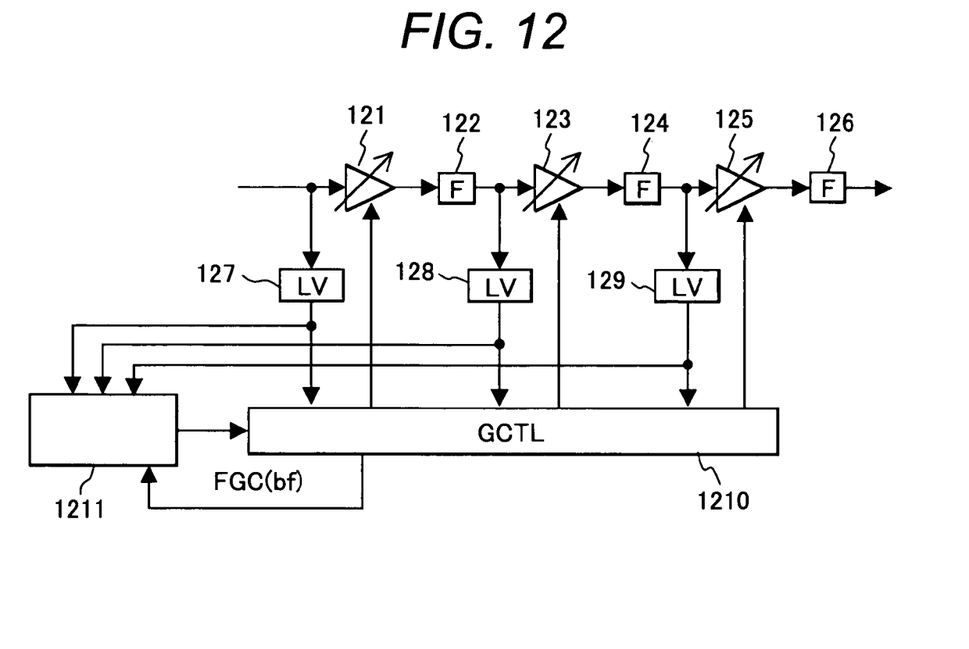
FIG. 12 is a block circuit diagram showing a preferred Embodiment 5 of the present invention.

FIG. 12 shows a preferred Embodiment 5 of the present invention. Features of Embodiment 5 are as follows. The time to stabilize the total amplification gain is shortened by reflecting information about each gain control to the following-stage gain control circuit. In addition, by evaluating the quantity of filtered signal attenuation, gain can be controlled so that a total signal gain of desired and interference signals input to the variable gain amplifiers concatenated in a multistage chain will be equal to an input dynamic range.

Circuitry of Embodiment 5 is made up of variable gain amplifiers 121, 123, and 125, filters (F) 122, 124, and 126, level detector circuits (LV) 127, 128, and 129 respectively connected to the inputs of the variable gain amplifiers, a filtered attenuation evaluating circuit (PRE-LVF) 1211 connected to the outputs of the level detector circuits, and a gain control circuit (GCTL) 1210.

The filtered attenuation evaluating circuit 1211 is used to determine the quantity of signal level attenuation by each filter. In general, because input signals involve an unknown quantity of interference components of unknown frequency, the quantity of signal attenuation by each filter cannot be predicted beforehand. However, the filtered attenuation evaluating circuit 1211 in the present embodiment is able to evaluate the quantity of actual signal attenuation induced by, for example, a filter 122, from the signal levels detected by the level detector circuits 127 and 128, as will be described later. Based on the thus evaluated signal attenuation and the signal level detected by the level detector circuit 127, the gain of the variable gain circuit 121 can be determined.

For example, if an input signal contains desired components only, the filter 122 does not cause attenuation of the signal level. The filtered attenuation evaluating circuit 1211 can actually evaluate that attenuation is 0 from the signal levels detected by the level detector circuits 127 and 128. Consequently, the gain control circuit 1210 controls the gain of the variable gain amplifier 121 so that the signal level output from the variable gain amplifier 121 does not exceed the input dynamic range of the following-stage variable gain amplifier 123.

Conversely, if the input signal includes a lot of interference, the signal level is attenuated by filters; for example, the signal level is assumed attenuated 10 dB by the filter 122. The filtered attenuation evaluating circuit 1211 can actually evaluate the attenuation of 10 dB from the signal levels detected. Consequently, the gain control circuit 1210 controls the gain of the variable gain amplifier 121 so that the signal level output from the variable gain amplifier 121 does not exceed the level that is 10 dB greater than the input dynamic range of the of the following-stage variable gain amplifier 123. However, if, as the result of this control, the signal level output from the variable gain amplifier 121 is saturated, the gain is reduced in order to avoid the saturation.

Figure 20:
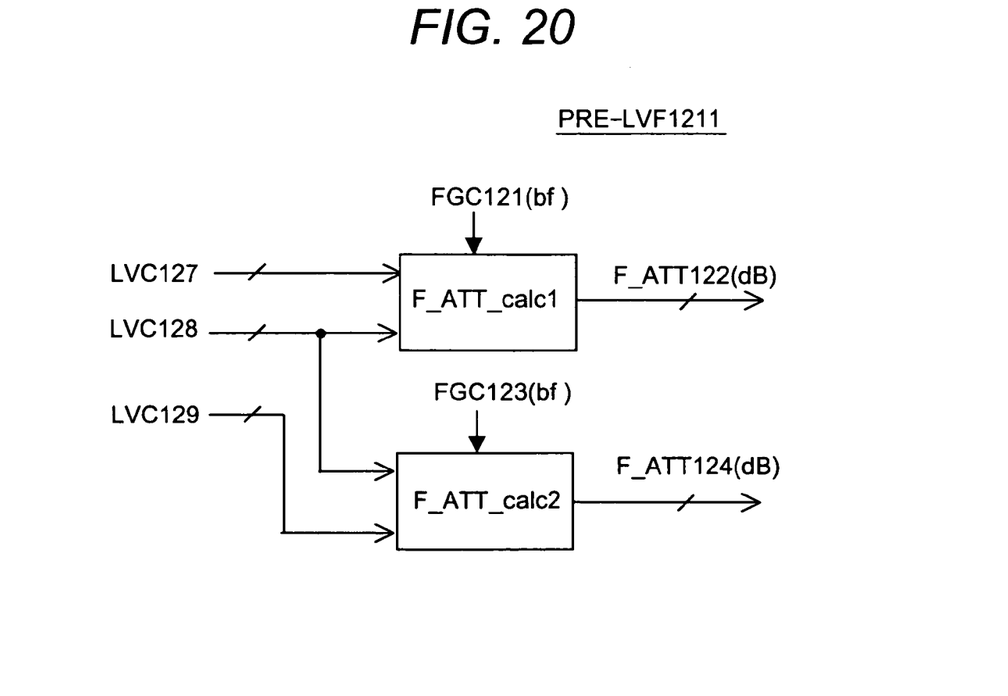
FIG. 20 is a diagram showing a topology example of a filtered attenuation evaluating circuit.

Using FIG. 20, the filtered attenuation evaluating circuit will be explained. The filtered attenuation evaluating circuit 1211 consists of two filtered attenuation calculation bocks 1 and 2 The filtered attenuation calculation bock 1 (F_ATT_calc1) evaluates the quantity of attenuation F_ATT122 by the filter 122 from the level code LVC127 output from the level detector circuit 127, level code LVC128 output from the level detector circuit 128, and last-time final gain code FGC121 (bf) from the variable gain amplifier 121. The filtered attenuation calculation bock 2 (F_ATT_calc2) evaluates the quantity of attenuation F_ATT124 by the filter 124 from the level code LVC128 output from the level detector circuit 128, level code LVC129 output from the level detector circuit 129, and last-time final gain code FGC123 (bf) from the variable gain amplifier 123.

Specifically, the filtered attenuation calculation bock 1 calculates the following: filtered attenuation F_ATT122 [dB]=LVC127 [dB]+FGC121 (bf) [dB]−LVC128 [dB]. The filtered attenuation calculation bock 2 calculates the following: filtered attenuation F_ATT124 [dB]=LVC128 [dB]+FGC123 (bf) [dB]−LVC129 [dB]. If the number of stages of variable gain circuits and filters is N, N−1 filtered attenuation calculation blocks should be provided to execute the same calculation as described above.

In FIG. 12, there is shown one output line, FGC (bf), from the gain control circuit 1210 to the filtered attenuation evaluating circuit 1211, which is shown as a representative of all discrete output lines for last-time final gain codes from the gain variable amplifiers to avoid complication which may occur if all the lines are drawn. The same applies to FIGS. 13 and 14 as well.

Figure 21:
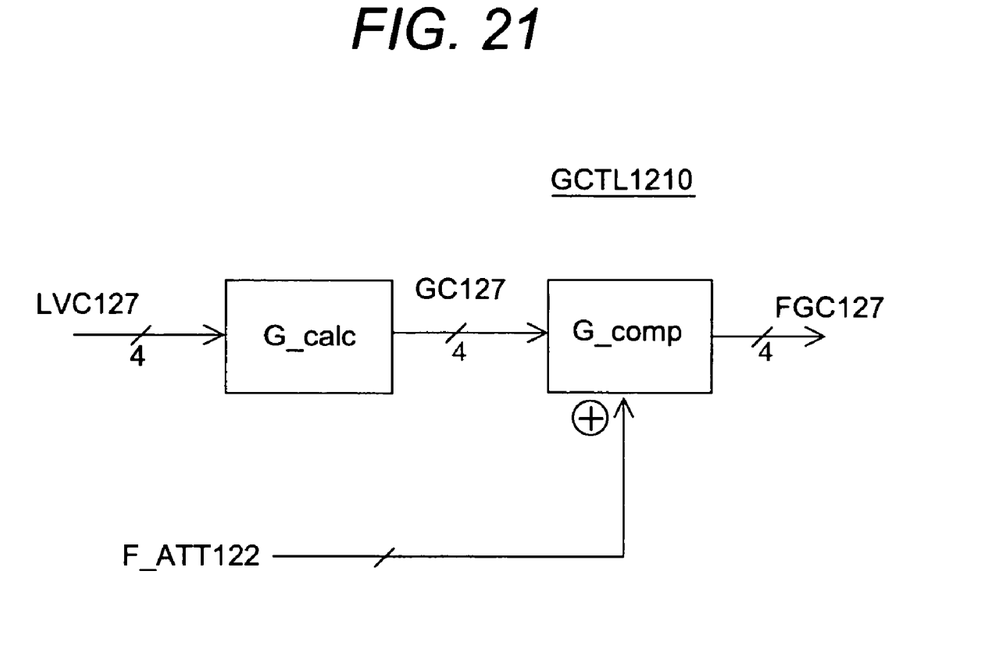
FIG. 21 is a diagram showing a rough topology of a gain control circuit shown in FIG. 12.

FIG. 21 shows an outline topology of the gain control circuit 1210 in FIG. 12. The final gain code for controlling the gain of the variable gain circuit 121 as a representative of the same circuits will now be explained. Because the same operation as will be described later is performed for other variable gain circuits 123 and 125 as well, these circuits are not shown and no explanation thereof is provided. As shown in FIG. 21, the gain control circuit 1210 consists of a gain calculation circuit block G_calc and a gain compensation circuit block G_comp.

The gain calculation circuit block G_calc obtains a gain code GC127 from the output LVC127 of the level detector circuit 127 and a target level (i.e., target output level) of the variable gain circuit 121. That is, it calculates the following: gain code GC127 [dB]=target level−LVC127 [dB].

The gain compensation circuit block G_comp compensates the gain code GC127 with the filtered attenuation F_ATT124 [dB] by the filter 122 obtained in the filtered attenuation evaluating circuit and thus obtains a final gain code FGC121 for the variable gain circuit 121. That is, it calculates the following: final gain code FGC121 [dB]=gain code GC127 [dB]+F_ATT122 [dB].

As described for the gain control circuit shown in FIG. 19 in the section of Embodiment 1, compensation based on preceding-stage gain control information INF_ΔG1 may be added.

If the corresponding circuitry is constructed by the prior art without applying the circuitry of Embodiment 5, then it is impossible to know signal level attenuation by the filter 122 and, therefore, the gain of the variable gain amplifier 121 will be controlled so that the signal level output from the variable gain amplifier does not exceed the input dynamic range of the following-stage variable gain amplifier 123, regardless of whether or not interference components are present. This control is necessary because, if the variable gain amplifier 121 is allowed to output the signal with more gain, the input of the following-stage variable gain amplifier 123 is saturated when no signal level attenuation is induced by the filter 122 if the signal involves no interference.

In such gain control method of prior art, conversely, when the signal involves a lot of interference, the gain of the variable gain amplifier 121 is reduced by the presence of the interference. Consequently, the level of desired signals passing through the filter 122 becomes small and susceptible-to noise.

Embodiment 5 overcomes this problem as described above. While the above description of Embodiment 5 refers particularly to attenuation by the filter 122, attenuation by the filter 124 can also be detected in the same manner as described above.

While the circuitry of FIG. 12 comprises three stages of variable gain amplifiers and three stages of filters, of course, the circuitry may be configured with any number of stages of these elements.

According to Embodiment 5, the time to stabilize the total amplification gain can be shortened by reflecting information about each gain control to the following-stage gain control circuit, as is the case in Embodiment 1 shown in FIG. 4. In addition, by evaluating the quantity of signal attenuation by a filter, gain can be controlled so that a total signal gain of desired and interference signals input to the variable gain amplifiers concatenated in a multistage chain will be equal to the input dynamic range.

<Embodiment 6>

Figure 13:
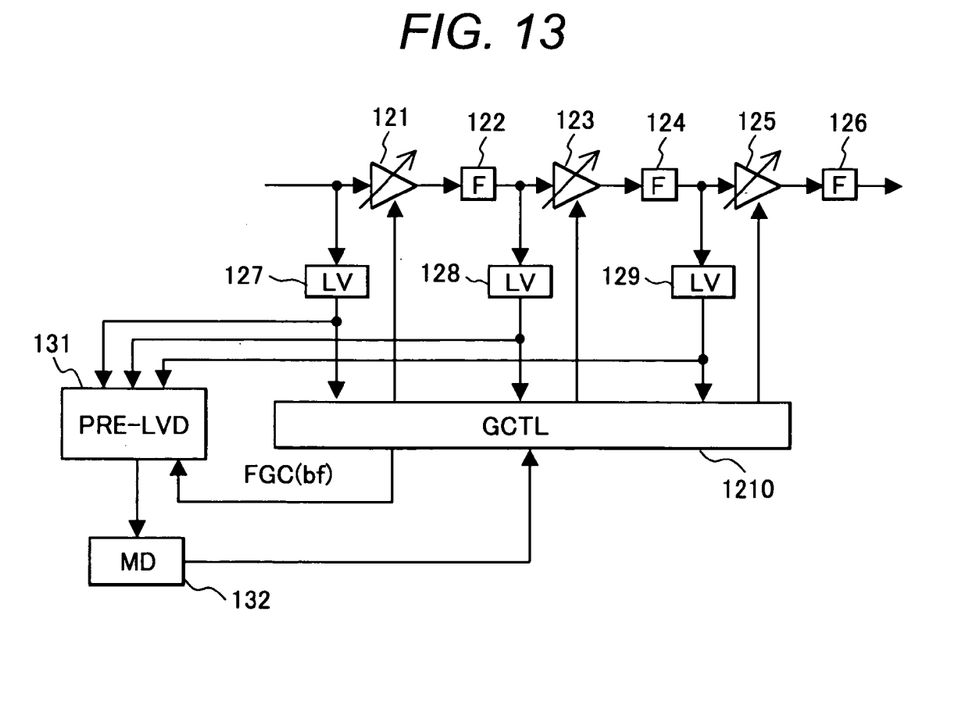
FIG. 13 is a block circuit diagram showing a preferred Embodiment 6 of the present invention.

FIG. 13 shows a preferred Embodiment 6 of the present invention. Embodiment 6 is configured to be the same circuitry as the above-discussed Embodiment 5 of FIG. 12. Difference resides in that the circuitry of Embodiment 6 includes an interference attenuation evaluating circuit (PRE-LVD) 131 replacing the filtered attenuation evaluating circuit 1211 and an interference attenuation retaining circuit (MD) and both circuits 131 and 132 operate during an idle mode.

Because ordinary receiving systems receive only interference signals during the idle mode, taking advantage of this period, the interference attenuation evaluating circuit 131 evaluates the quantity of interference signal attenuation, using the signal levels detected by the level detector circuits in the same manner as described for Embodiment 5 of FIG. 12.

Figure 22:
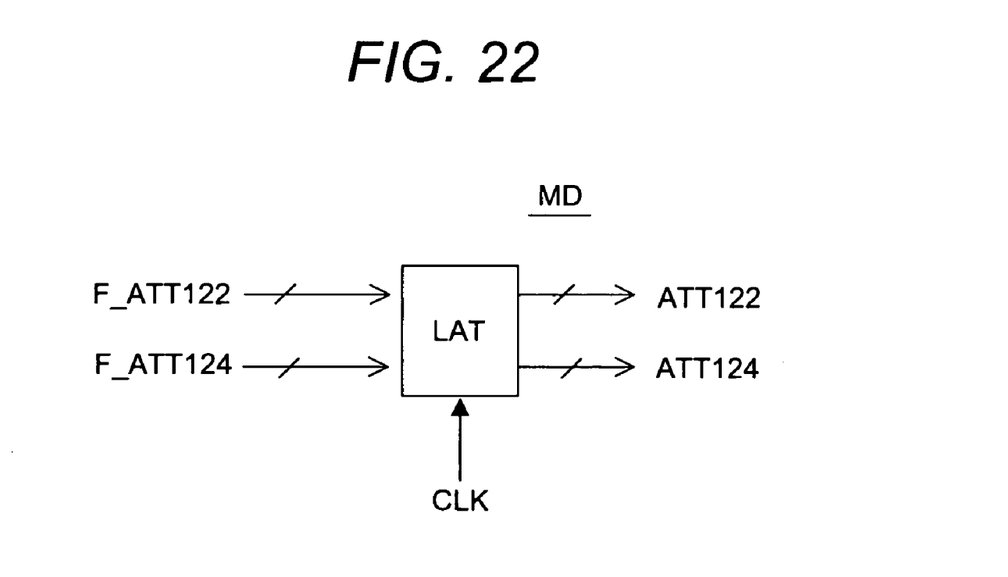
FIG. 22 is a diagram showing a topology example of an interference attenuation retaining circuit.

The configuration of this interference attenuation evaluating circuit 131 is the same as the filtered attenuation evaluating circuit (PRE-LVF) 1211 shown in FIG. 11 and only difference resides in that its output is filtered attenuation of interference signals, and, therefore, its topology is not shown. The interference attenuation retaining circuit (MD) 132 retains the evaluated quantity of interference attenuation. The configuration of the interference attenuation retaining circuit (MD) 132 is shown in FIG. 22. An ordinary CMOS clocked latch LAT may be applied as this circuit. Values of interference attenuation F_ATT 122 and F_ATT124 made by the filters 122 and 124 are stored into the latch immediately before the receiver leaves the idle mode. Then, the values of filtered attenuation ATT122 and ATT124 which were latched when the receiver receives are transmitted to the gain control circuit 1210 where the same processing as described with reference to FIG. 21. Signal CLK in FIG. 22 is supplied from a timing generation circuit which is not shown in the drawing. For example, this circuit is designed to output a rising pulse immediately before the receiver leaves the idle mode and the above values are stored into the latch in synchronization with this pulse. Embodiment 6 is effective when interference signal level during the receiving mode is sufficiently greater than the desired signal level.

As is the case in Embodiment 5 of FIG. 12, in Embodiment 6 also, the time to stabilize the total amplification gain can be shortened by reflecting information about gain control to the following-stage gain control circuit. In addition, by predicting interference signal level and desired signal level of input signals, from the interference signal level retrieved from the interference attenuation retaining circuit 132, gain can be controlled so that a total signal gain of desired and interference signals input to the variable gain amplifiers concatenated in a multistage chain will be equal to the input dynamic range. The interference attenuation evaluating circuit 131 and the interference attenuation retaining circuit 132 normally can receive a signal to tell whether idle or receiving mode in which the receiver stays now from a baseband processing section.

<Embodiment 7>

Figure 14:
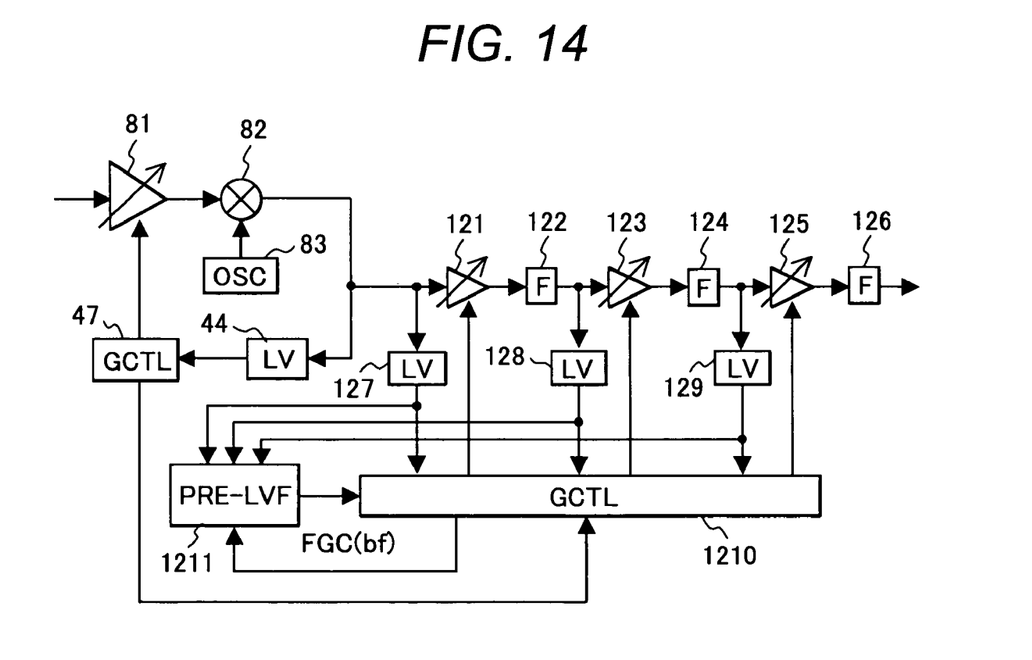
FIG. 14 is a block circuit diagram showing a preferred Embodiment 7 of the present invention.

FIG. 14 shows a preferred Embodiment 7 of the present invention. Embodiment 8 is an example where, as the section of the variable gain circuit 84 included in the circuitry of FIG. 8, its corresponding circuitry shown in FIG. 12 is used.

The thus configured circuitry enables high-speed gain control and can realize gain control that is less susceptible to noise even when interference signals are present than in prior-art variable gain amplifier circuits.

The variable gain amplifier circuits set forth in Embodiments 1 to 7 can be realized by using CMOS technology, for example, 0.18 $\mu$m, 2 V tolerant CMOS low voltage process.

Timing control applied in Embodiments 1 to 7 can be performed by using clock signals from the timing generation circuit which is not shown in the accompanying drawings.

While the present invention has been described specifically, based on its preferred embodiments, it will be appreciated that the present invention is not limited to the illustrative embodiments described hereinbefore and may be embodied in other modified forms without departing from its spirit or essential characteristics.

As is obvious from the embodiments described hereinbefore, according to the present invention, in the arrangement of multistage chain of variable gain circuits and its gain control circuits, the total amplification gain can be stabilized by gain control for a shorter period than in prior-art variable gain amplifier circuits.

In the receiver circuitry including a variable gain low-noise amplifier and variable gain, low frequency circuits, the total amplification gain can be stabilized by gain control for a shorter period than in prior-art variable gain amplifier circuits and stable data reception can be provided.

When input signals include large interference components, gain control that is less susceptible to noise than in prior-art variable gain amplifier circuits can be performed.

What is claimed is:

1. A variable gain amplifier circuit comprising:
   a plurality of variable gain circuits;
   a plurality of level detector circuits which detect signal levels at respective inputs of said plurality of variable gain circuits; and
   a plurality of gain control circuits which separately control respective gains of said plurality of variable gain circuits,
   wherein each of said plurality of gain control circuits determines a gain to be set therein, based on the signal level detected by one which is connected thereto of said plurality of level detector circuits and information about gain control directly received from a part or all of other gain control circuits existing in its preceding stage or stages.

2. The variable gain amplifier circuit according to claim 1, wherein said plurality of level detector circuits are connected to said plurality of variable gain circuits, respectively, and wherein said plurality of gain control circuits are connected to said plurality of level detector circuits, respectively.

3. The variable gain amplifier circuit according to claim 1, further comprising:
   a plurality of filters separately connected to respective outputs of said plurality of variable gain amplifiers; and
   a filtered attenuation evaluating circuit which evaluates the quantity of signal attenuation by said plurality of filters, based on the signal levels detected by said plurality of level detector circuits,
   wherein each of said gain control circuits controls the gain of one which is connected thereto of said variable gain amplifiers, based on signal attenuation evaluated by said filtered attenuation evaluating circuit and the signal level detected and output by one which is connected thereto of said plurality of level detector circuits.

4. The variable gain amplifier circuit according to claim 1, further comprising:
   a plurality of filters separately connected to respective outputs of said plurality of variable gain amplifiers;
   an interference attenuation evaluating circuit which evaluates the quantity of attenuation of interference signals, based on the signal levels detected by said plurality of level detector circuits, taking advantage of idle mode duration; and
   an interference attenuation retaining circuit which retains a value of attenuation evaluated by said interference attenuation evaluating circuit during a receiving mode,
   wherein each of said gain control circuits controls the gain of one which is connected thereto of said variable gain amplifiers, based on information of the value of attenuation of interference signals retained during said receiving mode and the signal level detected and output by one which is connected thereto of said plurality of level detector circuits.

5. A receiver circuit comprising:
   a variable gain low-noise amplifier which amplifies received high frequency signals;
   a mixer which converts a signal output from said variable gain low-noise amplifier into an intermediate frequency signal;
   a variable gain circuit which amplifies a signal output from the mixer;
   a first level detector circuit which detects the signal level of said variable gain low-noise amplifier;
   a first gain control circuit which controls the gain of said variable gain low-noise amplifier;
   a second level detector circuit which detects the signal level of said variable gain circuit; and
   a second gain control circuit which controls the gain of said variable gain circuit,
   wherein said first gain control circuit controls the gain of said variable gain low-noise amplifier, based on the signal level detected by said first level detector circuit, and supplies information about the gain control to said second gain control circuit, and
   wherein said second gain control circuit controls the gain of said variable gain circuit, based on the signal level detected by said second level detector circuit and said information about the gain control.

6. The receiver circuit according to claim 5, wherein said variable gain circuit comprises one or a plurality of variable gain amplifiers and one or a plurality of filters, wherein said second level detector circuit detects signal levels at respective inputs of said variable gain amplifiers, and wherein said second gain control circuit controls the gain or gains of said one or plurality of variable gain amplifiers.

7. The receiver circuit according to claim 6, wherein said first level detector circuit is connected to the inputs of said variable gain amplifiers.

8. The receiver circuit according to claim 5, wherein said variable gain circuit comprises one or a plurality of variable gain amplifiers and one or a plurality of filters, wherein said second level detector circuit detects signal levels at respective outputs of said variable gain amplifiers, and wherein said second gain control circuit controls respective gains of said variable gain amplifiers.

9. The receiver circuit according to claim 5, further comprising:

a plurality of filters separately connected to respective outputs of said plurality of variable gain amplifiers; and a filtered attenuation evaluating circuit which evaluates the quantity of signal attenuation by said plurality of filters, based on the signal levels detected by said plurality of level detector circuits, wherein said gain control circuit controls the respective gains of said variable gain amplifiers, based on signal attenuation evaluated by said filtered attenuation evaluating circuit and the signal levels detected and output by said plurality of level detector circuits.

10. The receiver circuit according to claim 5, further comprising:

a plurality of filters separately connected to respective outputs of said plurality of variable gain amplifiers;

an interference attenuation evaluating circuit which evaluates the quantity of attenuation of interference signals, based on the signal levels detected by said plurality of level detector circuits, taking advantage of idle mode duration; and an interference attenuation retaining circuit which retains a value of attenuation evaluated by said interference attenuation evaluating circuit during a receiving mode, wherein said gain control circuit controls the respective gains of said variable gain amplifiers, based on information of the value of attenuation of interference signals retained during said receiving mode and the signal levels detected and output by said plurality of level detector circuits.

* * * * *